United States Patent
Chun

(10) Patent No.: US 7,061,824 B2
(45) Date of Patent: Jun. 13, 2006

(54) ADDRESS BUFFER CIRCUIT FOR MEMORY DEVICE

(75) Inventor: Jun Hyun Chun, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/108,308

(22) Filed: Apr. 18, 2005

(65) Prior Publication Data

US 2006/0056268 A1    Mar. 16, 2006

(30) Foreign Application Priority Data

Sep. 13, 2004    (KR) ...................... 10-2004-0073035

(51) Int. Cl.
*G11C 8/00* (2006.01)
(52) U.S. Cl. ................. 365/230.08; 365/193; 365/203; 365/230.03
(58) Field of Classification Search ................ 365/193, 365/203, 230.03, 230.08
See application file for complete search history.

(56) References Cited

U.S. PATENT DOCUMENTS

| | | | |
|---|---|---|---|
| 5,450,341 A * | 9/1995 | Sawada et al. ......... | 365/185.24 |
| 5,504,710 A * | 4/1996 | Somon ................... | 365/189.05 |
| 6,256,260 B1 * | 7/2001 | Shim et al. .................. | 365/233 |
| 6,704,242 B1 * | 3/2004 | Kobayashi ............. | 365/230.08 |
| 2005/0174827 A1 * | 8/2005 | Yeh ............................ | 365/120 |

* cited by examiner

*Primary Examiner*—Hoai V. Ho
(74) *Attorney, Agent, or Firm*—Ladas & Parry LLP

(57) ABSTRACT

Disclosed is an address buffer circuit for a memory device, the address buffer circuit comprising: a first address input buffer group and a second address input buffer group for receiving an address signal applied from the exterior; and a control unit for controlling operation of the second address input buffer group. Herein, operation of the first address input buffer group is controlled by a first control signal, and the control unit receives a second control signal enabled when all banks of the memory device enter an active state and controls operation of the second address input buffer group.

4 Claims, 4 Drawing Sheets

ADDRESS BUFFER CIRCUIT FOR MEMORY DEVICE

BACKGROUND OF THE INVENTION

1. Field of the Invention

The present invention relates to a memory device, and more particularly to a memory device having an address buffer circuit which reduces current consumption.

2. Description of the Prior Art

FIG. 1 is a block diagram illustrating a normal address buffer circuit used in a memory device (e.g., 512M SDRAM). In FIG. 1, a control signal (EN) is an enable signal for controlling the operation of input buffers 111 to 118.

As shown in FIG. 1, an address signal output from a memory controller (not shown) is applied to the input buffers 111 to 118 via address pins 101 to 108. Address signals AI<0> to AI<13>, BAI<0> and BAI<1> output from the input buffers are applied to the interior of the memory device. Herein, the address signals AI<0> to AI<13> are used as row addresses and/or column addresses, and the address signals BAI<0> and BAI<1> are used as bank address signals to select a bank of the memory device.

FIG. 1 shows the configuration of the address buffer circuit generally used for a 512M DDR2 SDRAM. With respect to the 512M DDR SDRAM, Joint Electron Device Engineering Council (JEDEC) standard specifications require an address configuration as shown in Table 1 below.

TABLE 1

|  | Configuration | | |
| --- | --- | --- | --- |
|  | 128 M × 4 | 64 M × 8 | 32 M × 16 |
| Bank address | BA0, BA1 | BA0, BA1 | BA0, BA1 |
| Auto precharge | A10 | A10 | A10 |
| Row address | A0~A13 | A0~A13 | A0~A12 |
| Column address | A0~A9, A11 | A0~A9 | A0~A9 |

Referring to Table 1, it can be understood that different row addresses and column addresses are used depending on the configuration of the 512M DDR2 SDRAM.

For example, when the 512M DDR2 SDRAM is used as the 128M×4 and the 64M×8, address signals A0 to A9 and A11 to A13 are used as row address signals. However, when the 512M DDR2 SDRAM is used as the 32M×16, address signals A0 to A9, A11 and A12 are used as row address signals.

Also, when the 512M DDR2 SDRAM is used as the 128M×4, address signals A0 to A9 and A11 are used as column address signals. However, when the 512M DDR2 SDRAM is used as the 64M×8 and the 32M×16, address signals A0 to A9 are used as column address signals.

As described above, depending on the configuration of the 512M DDR2 SDRAM, a specific address and an address input buffer corresponding to the specific address may not be used. In spite of such conditions, if the operations of the address input buffers 111 to 118 are uniformly determined by a control signal (EN), unnecessary consumption of current is caused by an unused address input buffer.

According to the prior art, as shown in FIG. 1, when the 512M DDR2 SDRAM is used as the 32M×16, a NAND gate element 10 is employed for disabling the operation of an address input buffer 116 unused in the configuration of the 32M×16.

However, the conventional address buffer circuit shown in FIG. 1 has a problem in that it does not provide a function of controlling address input buffers selectively according to the characteristics of each memory device presented in Table 1.

SUMMARY OF THE INVENTION

Accordingly, the present invention has been made to solve the above-mentioned problems occurring in the prior art, and the present invention proposes a circuit capable of controlling the operation of an address buffer selectively according to the configuration of a memory device.

In particular, the present invention provides a circuit capable of preventing unnecessary current consumption by disabling the operation of an address input buffer used only as a row address, when the circuit is in an operation mode using only column addresses according to configuration of a memory.

In order to accomplish these objects, there is provided an address buffer circuit for a memory device, the address buffer circuit comprising: a first address input buffer group and a second address input buffer group for receiving an address signal applied from the exterior; and a control unit for controlling operation of the second address input buffer group.

According to the present invention, operation of the first address input buffer group is controlled by a first control signal, and the control unit receives a second control signal enabled when all banks of the memory device enter an active state and controls operation of the second address input buffer group.

According to the present invention, buffers of the second address input buffer group are used as only row address input buffers but are not used as column address input buffers.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
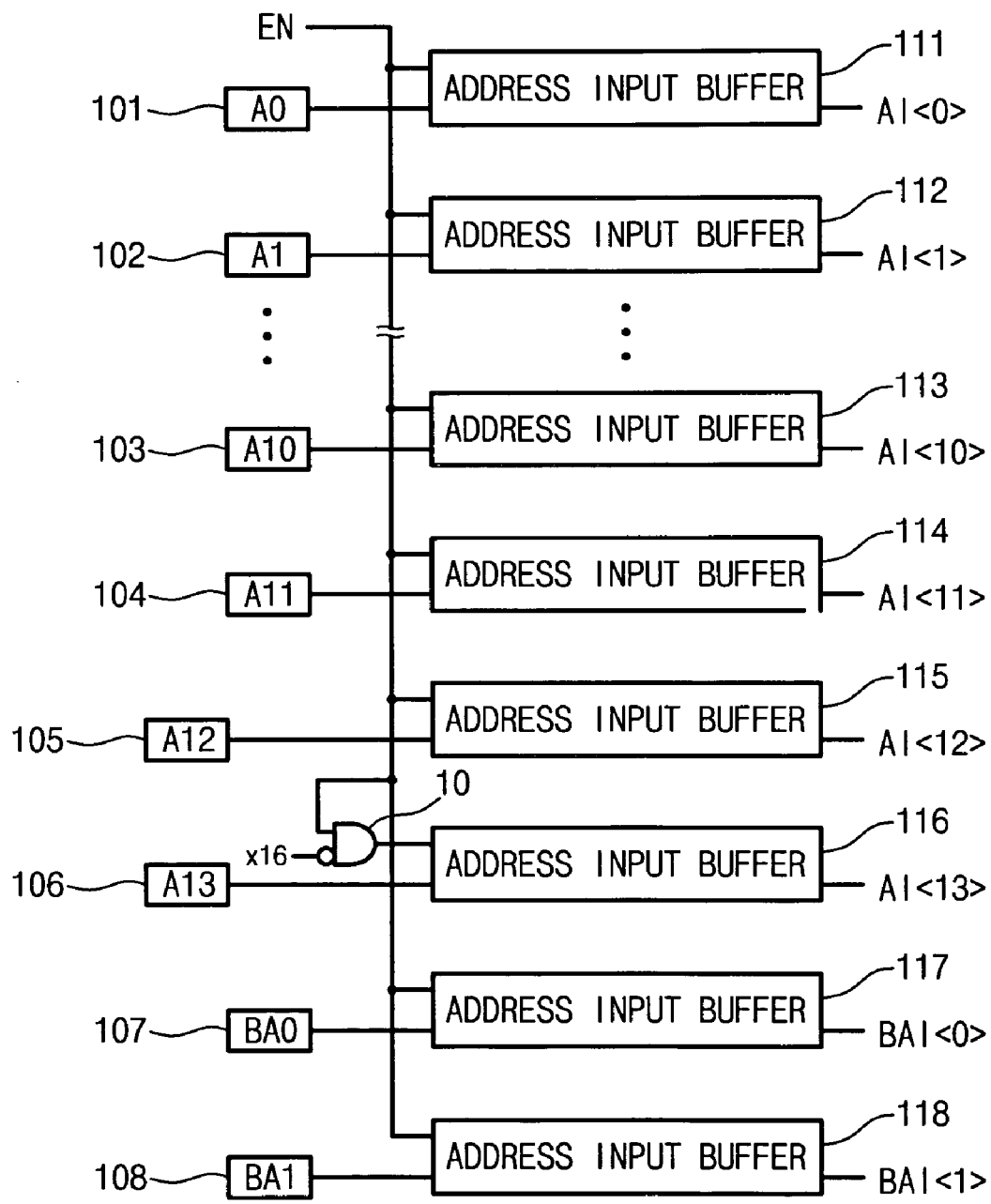
FIG. 1 is a block diagram illustrating a normal address buffer circuit used in a memory device.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
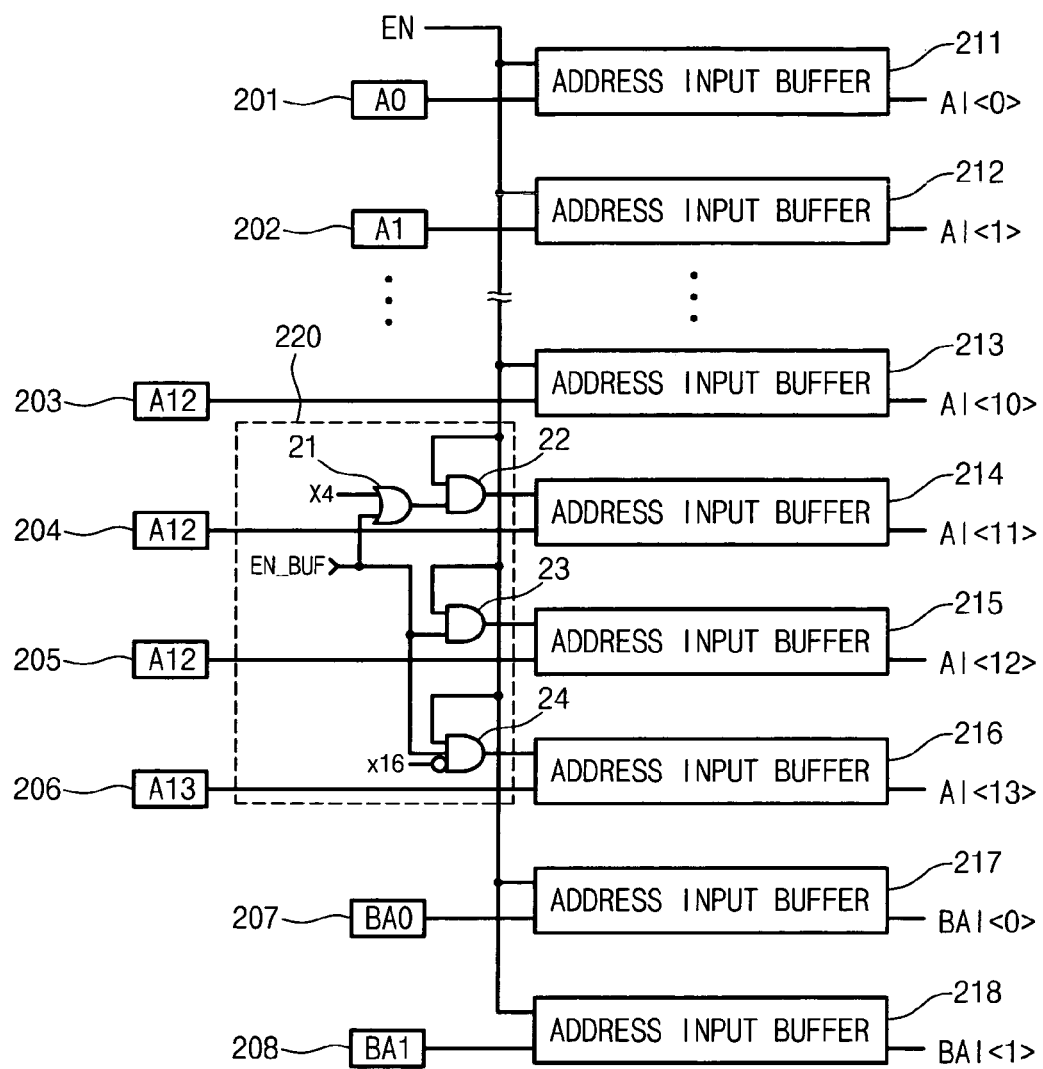
FIG. 2 is a block diagram illustrating an address buffer circuit according to an embodiment of the present invention.

FIG. 2 is a block diagram illustrating an address buffer circuit according to an embodiment of the present invention.

For reference, the address buffer circuit shown in FIG. 2 is an address buffer circuit used in a 512M DDR2 SDRAM.

The address buffer circuit of FIG. 2 includes address pins 201 to 208 for receiving an address signal applied from the exterior, address input buffers 211 and 212 for receiving an address signal having passed through the address pins 201 to 208, and a control unit 220 for controlling the operations of address input buffers 214, 215 and 216.

In FIG. 2, a control signal EN is a signal for controlling the operations of address input buffers 211, 212, 213, 218 and 219, '×4' is a signal to be enabled when a memory device is used as 128M×4, and '×16' is a signal to be enabled when a memory device is used as 32M×16. Address signals AI<0> to AI<13> output from the address input buffers are used as a row address or a column address, which is applied to the interior of the memory device to appoint a specific memory cell. Address signals BAI<0> and BAI<!> is used as a signal for selecting a bank of the memory device when there are four banks.

Referring to FIG. 2, the control unit 220 includes: an OR gate 21 for receiving a control signal EN_BUF and a signal '×4'; a first AND gate 22 for receiving an output signal of the OR gate 21 and the control signal EN; a second AND gate 23 for receiving the control signal EN_BUF and the control signal EN; and a third AND gate 24 for receiving the control signal EN_BUF, the control signal EN and an inverted signal of the signal '×4'.

An output signal of the first AND gate 22 controls the operation of the address input buffer 214, an output signal of the second AND gate 23 controls the operation of the address input buffer 215, and an output signal of the third AND gate 24 controls the operation of the address input buffer 216.

Figure 3:
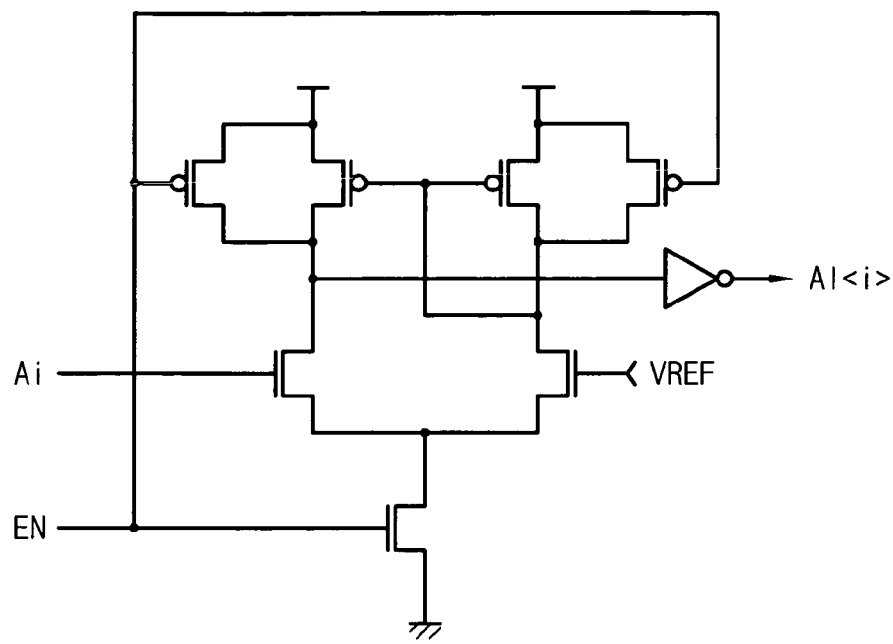
FIG. 3 is a circuit diagram illustrating an example of the address input buffer shown in FIG. 2.

FIG. 3 is a circuit diagram illustrating an example of the address input buffer shown in FIG. 2. Those skilled in the art will appreciate that various modified circuits having the same function as the circuit of the address input buffer shown in FIG. 3 may be employed instead of the circuit of FIG. 3. In FIG. 3, 'Ai' represents an address signal, 'VREF' represents a reference voltage, 'EN' represents a control signal for controlling the operation of the circuit, and 'AI<i>' represents an address signal output from the address input buffer.

Figure 4:
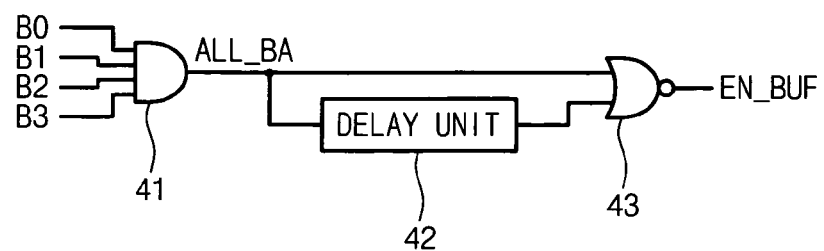
FIG. 4 is a circuit diagram illustrating an example of the control unit for the address input buffers shown in FIG. 2.

FIG. 4 is a circuit diagram illustrating an example of the control unit 220 for the address input buffers shown in FIG. 2.

As shown in FIG. 4, the control unit 220 includes an AND gate 41, a delay unit 42 for receiving an output signal ALL_BA of the AND gate 41, and a NOR gate 43 for receiving an output signal of the AND gate 41 and an output signal of the delay unit 42.

In FIG. 4, the AND gate 41 receives signals B0 to B3 representing whether or not each bank is in an active state, and the NOR gate 43 outputs an output signal 'EN_BUF'. The output signal 'EN_BUF' of the NOR gate 43 is applied to the control unit 220 shown in FIG. 2. In FIG. 2, the signal B0 representing whether or not each bank is in an active state is enabled into a high level when bank addresses BA1 and BA0 are 'L' and 'L', respectively. The signal B1 is enabled into a high level when bank addresses BA1 and BA0 are 'L' and 'H', respectively. The signal B2 is enabled into a high level when bank addresses BA1 and BA0 are 'H' and 'L', respectively. The signal B3 is enabled into a high level when bank addresses BA1 and BA0 are 'H' and 'H', respectively.

Figure 5:
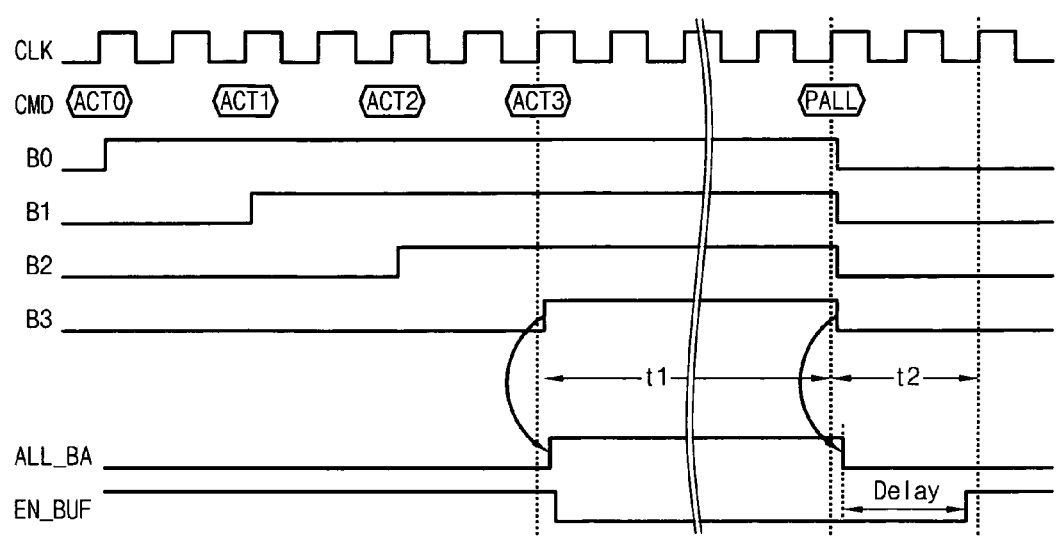
FIG. 5 is a timing diagram for illustrating the operation of the circuit according to an embodiment of the present invention.

FIG. 5 is a timing diagram for illustrating the operation of the circuit according to an embodiment of the present invention.

In FIG. 5, 'CLK' represents an interior clock signal of the memory device and 'CMD' represents a command signal. Also, 'B0' to 'B3', 'ALL_BA' and 'EN_BUF' represent signals used in the circuit of FIG. 4.

As shown in FIG. 5, a bank-active signal B0 which activates one of four banks (not shown) is enabled by a command signal of 'ACT0', and a bank-active signal B1 which activates one of the remaining three banks (not shown) is enabled by a command signal of 'ACT1'. Then, a bank-active signal B2 which activates one of the remaining two banks (not shown) is enabled by a command signal of 'ACT2', and a bank-active signal B3 which activates the remaining bank (not shown) is enabled by a command signal of 'ACT3'. When all the active signals B0 to B3 are enabled as described above, the output signal 'ALL_BA' of the AND gate 41 in FIG. 4 changes from a low level to a high level. Therefore, as shown in FIGS. 4 and 5, the output signal 'EN_BUF' of the control unit changes from a high level to a low level.

Hereinafter, the operation of the circuit according to an embodiment of the present invention will be described with reference to FIGS. 2 to 5.

Firstly, the operation of the circuit will be described with respect to a case in which at least one bank is in an idle state. In other words, the circuit to which a row address signal can be applied will now be described. This means that at least one of signals B0 to B3 is maintained at a low level. In this case, the control signal 'EN_BUF' applied to the control unit 220 has a high level (see FIG. 4). Accordingly, as described with reference to Table 1, it can be understood that the row address pins A0 to A13 and the address input buffers 211 to 216 corresponding to them are all used when the memory device is configured as 128M×4 or 64M×8, and only the row address pins A0 to A12 and the address input buffers 211 to 215 corresponding to them are used when the memory device is configured as 32M×16.

Hereinafter, the operation of the circuit will be described with respect to the case in which all the banks are in an active state. In this case, since all the banks are in an active state, there is no bank to be activated any further. Therefore, in view of reduction of power consumption, it is more effective to stop the operation of an address input buffer used for reception of only a row address signal. The present invention provides a technique for selectively stopping the operation of the address input buffers depending on configuration of a memory device when all the banks are in an active state. Hereinafter, such a technique will be described in more detail.

When all the banks are in an active state, all the signals B0 to B3 are maintained at a high level. In this case, the control signal 'EN_BUF' applied to the control unit 220 has a low level (See FIG. 4). While the output signal 'EN_BUF' of the control unit 220 is being maintained at a low level, _address signals applied to the address input buffers 211 to 216 of FIG. 2 will be used as only column addresses. This is because all the banks have been already activated by the bank-active signal B0 to B3.

Therefore, as described with reference to Table 1, in the case of configuring a 128M×4 memory device, it can be understood that column address pins A0 to A9 and A11 and address input buffers corresponding to them are used, and the operation of the column address buffers 215 and 216 stops. In this case, in the control unit of FIG. 2, the signal '×4' has a high level and the signal '×16' has a low level.

Also, in the case of configuring a 64M×8 memory device, it can be understood that column address pins A0 to A9 and address input buffers corresponding to them are used, and the operation of the column address buffers 214, 215 and 216 stops. In this case, in the control unit of FIG. 2, both of the signals 'x4' and 'x6' have a low level.

Also, in the case of configuring a 32M×16 memory device, it can be understood that column address pins A0 to A9 and the address input buffers corresponding to them are used, and the operation of the column address buffers 214 and 215 stops. In this case, in the control unit of FIG. 2, the signal 'x4' has a Low level and the signal 'x16' has a high level. For reference, in the case of the 32M×16 memory device, an address pin 206 and the address buffer 216 are not used during the operation for row and column addresses.

As described above, according to an embodiment of the present invention, the address buffer circuit shown in FIG. 2 reduces current consumption by selectively stopping the operation of address buffers, which does not receive a column address signal, from among address buffers used for the reception of a row address signal.

As shown in FIG. 5, from after all the banks enter an active state until at least one bank enters an idle state from after, the output signal 'EN_BUF' of the control unit is maintained at a low level for a time period of 't1'. After the time period of 't1', that is, when at least one bank enters the idle state, the output signal 'EN_BUF' of the control unit changes into a high level after a time period of 't2' elapses. Herein, 't2' represents RAS precharge time (tRP). This is because a new bank-active instruction can be applied, only after the RAS precharge time elapses from the point of time at which at least one bank enters the idle state.

As described above, the address buffer circuit according to an embodiment of the present invention can reduce current consumption by stopping the operation of address buffers unused according to the configuration of a memory device when a column address signal is applied thereto.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An address buffer circuit for a memory device, the address buffer circuit comprising:
    a first address input buffer group and a second address input buffer group for receiving an address signal applied from the exterior; and
    a control unit for controlling operation of the second address input buffer group, wherein,
    operation of the first address input buffer group is controlled by a first control signal, and the control unit receives a second control signal enabled when all banks of the memory device enter an active state and controls operation of the second address input buffer group.

2. The address buffer circuit as claimed in claim 1, wherein buffers of the second address input buffer group are used as only row address input buffers but are not used as column address input buffers.

3. The address buffer circuit as claimed in claim 1, wherein, when at least one bank from among all banks maintaining an active state enters an idle state, the second control signal changes into a disable state after a predetermined period of time.

4. The address buffer circuit as claimed in claim 3, wherein the predetermined period of time is RAS precharge time.

* * * * *